US008107555B2

(12) United States Patent
Tanabe (10) Patent No.: US 8,107,555 B2
(45) Date of Patent: Jan. 31, 2012

(54) PRE-EMPHASIS AUTOMATIC ADJUSTING SYSTEM, METHOD OF ADJUSTING PRE-EMPHASIS AND PRE-EMPHASIS SETTING SIGNAL GENERATING CIRCUIT

(75) Inventor: Motoi Tanabe, Tokyo (JP)

(73) Assignee: NEC Corporation, Tokyo (JP)

(*) Notice: Subject to any disclaimer, the term of this patent is extended or adjusted under 35 U.S.C. 154(b) by 871 days.

(21) Appl. No.: 12/059,328

(22) Filed: Mar. 31, 2008

(65) Prior Publication Data
US 2008/0240291 A1 Oct. 2, 2008

(30) Foreign Application Priority Data
Mar. 30, 2007 (JP) ................................. 2007-093509

(51) Int. Cl.
*H04K 1/02* (2006.01)
*H04L 25/03* (2006.01)
*H04L 25/49* (2006.01)
(52) U.S. Cl. ....................................... 375/296; 375/295

(58) Field of Classification Search .................. 375/295, 375/296
See application file for complete search history.

(56) References Cited

U.S. PATENT DOCUMENTS
2006/0028704 A1* 2/2006 Inoue et al. .................... 359/237
2006/0159450 A1* 7/2006 Peisl et al. ....................... 398/26
2008/0056344 A1* 3/2008 Hidaka .......................... 375/232

FOREIGN PATENT DOCUMENTS
JP 2004112059 A 4/2004
* cited by examiner

*Primary Examiner* — David C. Payne
*Assistant Examiner* — Erin File

(57) ABSTRACT

A pre-emphasis automatic adjusting system is provided which is capable of placing the best suitable emphasis against attenuation occurring in a through hole. A step signal is transmitted from a transmitting circuit via a signal transmission path to a receiving circuit with termination of the receiving circuit being released. A voltage of its reflected signal is compared with a first reference voltage of a first reference voltage source. Based on a comparison result in a capacitive reflection section in which a voltage of the reflected signal is less than the first reference voltage, a section detecting signal is outputted from a reflected wave detecting circuit.

18 Claims, 7 Drawing Sheets

- 14c; Signal Wiring
- 14b
- 14e
- 14a; Wiring Board
- 14d; Through Hole (Occurrence of Capacitive Reflection)
- 14f; Signal Wiring

FIG.3

- S1; Capacitive Reflection in Through Hole
- S2; Total Reflection
- Reflected Section Corresponding to Reciprocation in Through Hole  t [s]

PRE-EMPHASIS AUTOMATIC ADJUSTING SYSTEM, METHOD OF ADJUSTING PRE-EMPHASIS AND PRE-EMPHASIS SETTING SIGNAL GENERATING CIRCUIT

INCORPORATION BY REFERENCE

This application is based upon and claims the benefit of priority from Japanese Patent Application No. 2007-093509, filed on Mar. 30, 2007, the disclosure of which is incorporated herein in its entirely by reference.

BACKGROUND OF THE INVENTION

1. Field of the Invention

The present invention relates to a pre-emphasis automatic adjusting system, a method for adjusting pre-emphasis and an emphasis setting signal generating circuit and more particularly to the pre-emphasis automatic adjusting system, the method for adjusting the pre-emphasis, and the emphasis setting signal generating circuit effective for placing the best suitable pre-emphasis on a transmitting signal even when a mismatched portion occurs in a signal transmission path.

2. Description of the Related Art

Figure 7:
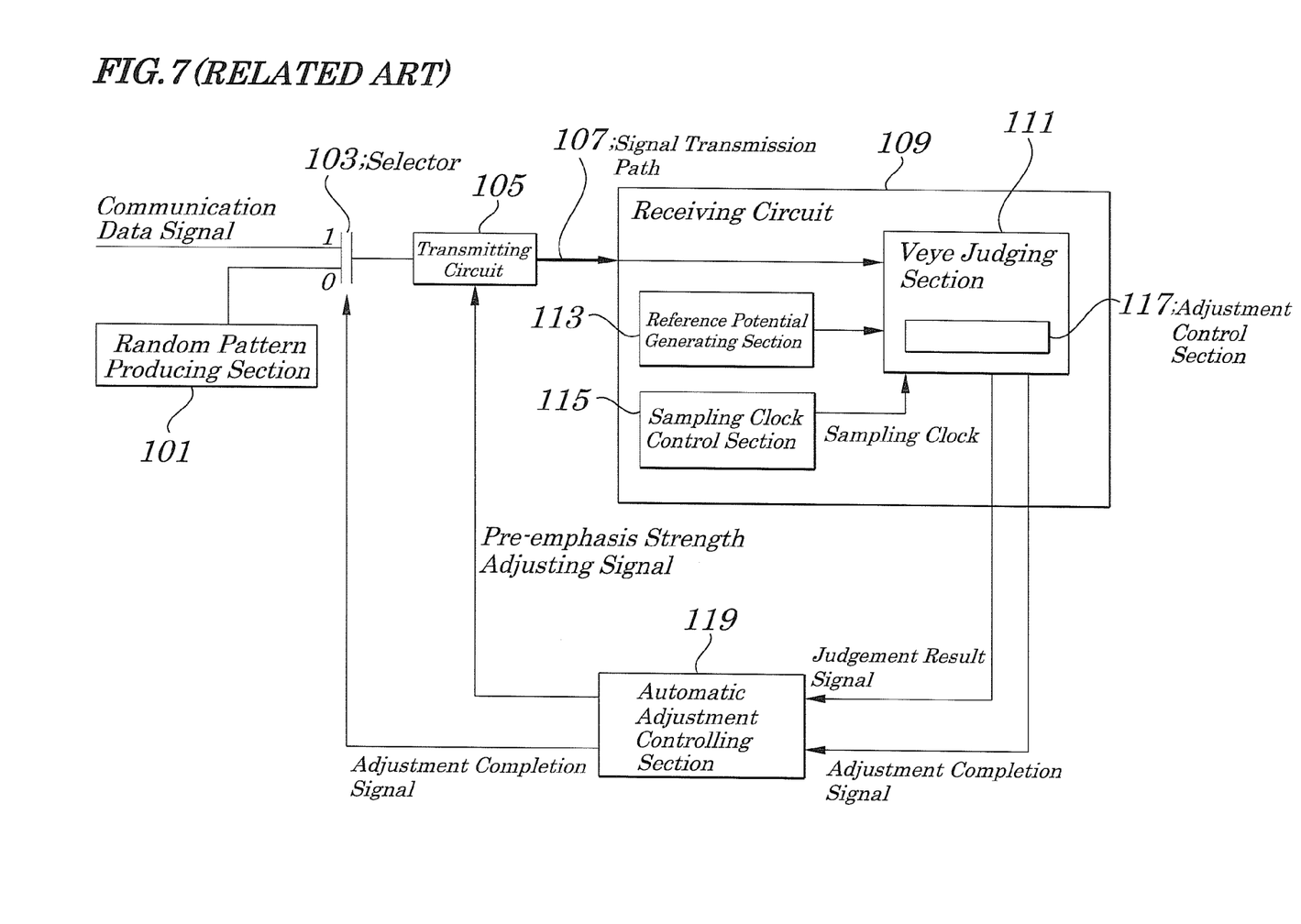
FIG. 7 is a diagram showing electrical configurations of a related pre-emphasis automatic adjusting system.

Conventionally, a signal transmitting system employs its pre-emphasis automatic adjusting means. The pre-emphasis automatic adjusting means is configured to ensure normal receiving of a signal by a signal receiving circuit by removing an influence by attenuation in a signal transmission path on the signal to be transmitted from a transmitting circuit of the signal transmitting system through the signal transmission path to a receiving circuit. FIG. 7 is an example of its configurations.

In the pre-emphasis automatic adjusting system (hereafter simply referred to as a known system) shown in FIG. 7, at a time of pre-emphasis automatic adjustment, a randomly patterned signal generated in a random pattern producing section 101 is transmitted through a selector 103, transmitting circuit 105, and signal transmission path 107 to a receiving circuit 109. In the receiving circuit 109 to receive the randomly patterned signal, its Veye judging section 111 compares a voltage of the randomly patterned signal with a reference voltage from a reference potential generating section 113 to obtain a value (Veye) of an eye opening in a voltage direction. The Veye is obtained by using a sampling clock outputted from a sampling clock control section 115 which controls timing of the sampling clock showing the Veye in a central portion of the received eye opening.

Figure 8:
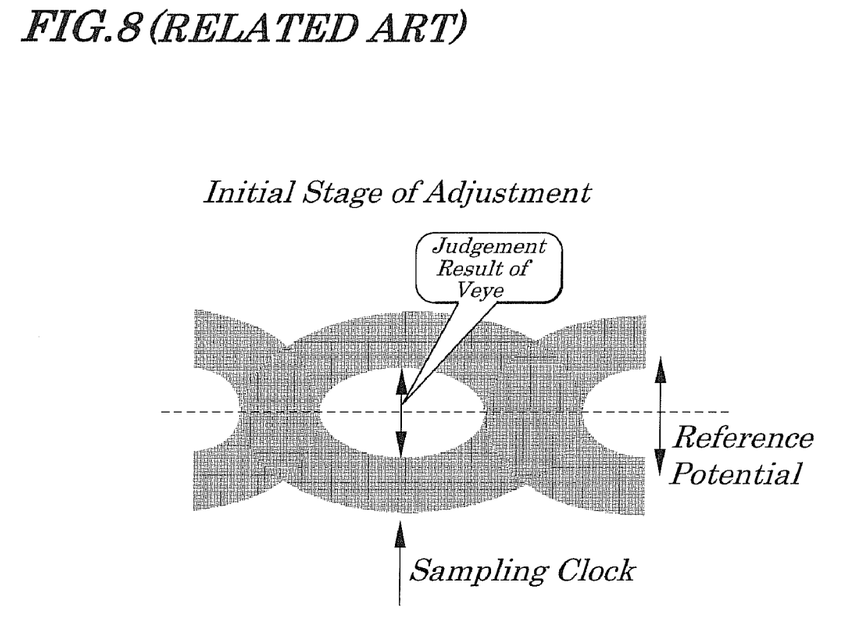
FIG. 8 is a diagram showing an eye opening at an initial time of adjustment in the related system of FIG. 7.
Figure 9:
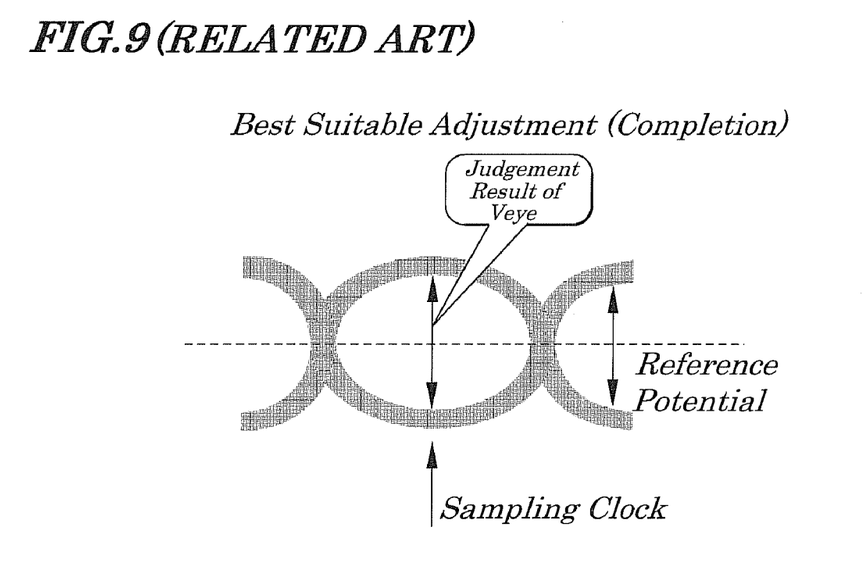
FIG. 9 is a diagram showing the eye opening at a time of completion of the adjustment in the related system of FIG. 7.

When the Veye obtained as above is less than a desired Veye, a judgment result is transferred from an adjustment control section 117 to an automatic adjustment controlling section 119. The automatic adjustment controlling section 119 transmits a pre-emphasis strength adjusting signal to the transmitting circuit 105. The transmitting circuit 105 changes pre-emphasis to be placed on a transmitting signal by a specified value. Feedback control is exerted repeatedly until the above Veye becomes the maximum. The signal receiving state in which its eye opening was as shown in FIG. 8 at an initial stage of the pre-emphasis automatic adjustment described above becomes a state in which the pre-emphasis adjustment becomes the best suitable. That is, when the pre-emphasis is completed, the state of the eye opening becomes the state shown in FIG. 9.

Moreover, an example of a pre-emphasis automatic adjusting system is disclosed in Patent Reference 1 (Japanese Patent Application Laid-open No. 2004-112059). The Patent Reference 1 discloses the pre-emphasis automatic adjusting means in which a test signal transmitted from a transmitting circuit is made to be reflected by a receiving circuit and the reflected signal is effectively utilized by the transmitting circuit to achieve pre-emphasis automatic adjustment being a desired object of the invention. The disclosed pre-emphasis adjusting means is so configured that, at a time of the pre-emphasis automatic adjustment, by control from a transmitting side, a receiving terminal of a receiving circuit is opened and that, in this state, a test signal being a step pulse is transmitted from a transmitting circuit through a signal transmission path to the receiving circuit and the test signal is reflected by the receiving circuit and is returned back to the transmitting circuit.

A potential of the reflected signal is compared with a pre-set comparison potential by a comparison circuit to measure a potential difference. A controller receiving this information about the potential difference judges a magnitude of the attenuation of a high-frequency signal. If the potential of the reflected signal is larger than that of the pre-set comparison potential, the controller sends a control signal to a circuit for output strength adjustment to emphasize a high-frequency component of the transmitted signal according to the magnitude of the attenuation of the high-frequency signal.

However, the above known related system has a problem. That is, in the known system, it is necessary that circuits required for the pre-emphasis automatic adjustment are installed in both the transmitting circuit and the receiving circuit, causing an increase in circuit areas necessary to configure the transmitting circuit and the receiving circuit. In addition to the disadvantage of physical configurations, another disadvantage exists. That is, in the known system, after eye opening of the randomly patterned signal received by the receiving circuit is made calm, the Veye is measured and a pre-emphasis strength adjusting signal (emphasis strength indicating signal) is transmitted to the transmitting side. Then, emphasis corresponding to a pre-emphasis strength adjusting signal is placed on a randomly patterned signal which is transmitted to the receiving circuit and appropriateness of the emphasis placed based on the measurement of the Veye of the randomly patterned signal is judged and these procedures have to be repeated to perform the best suitable pre-emphasis automatic adjustment. This is an unavoidable technological disadvantage. This causes not only an increase in time required before the completion of adjustment but also complication of adjusting procedures.

Figure 10:
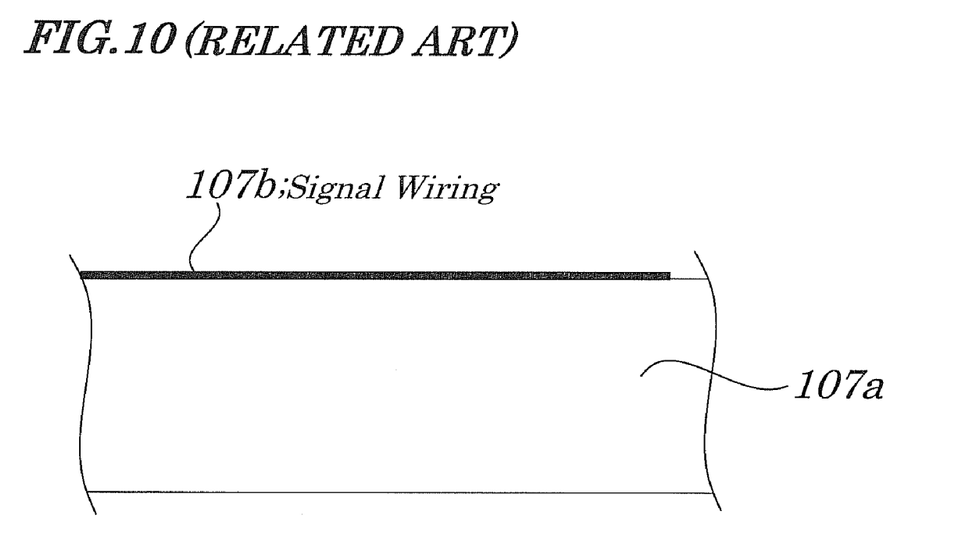
FIG. 10 is a diagram showing a related signal wiring having no through hole.
Figure 11:
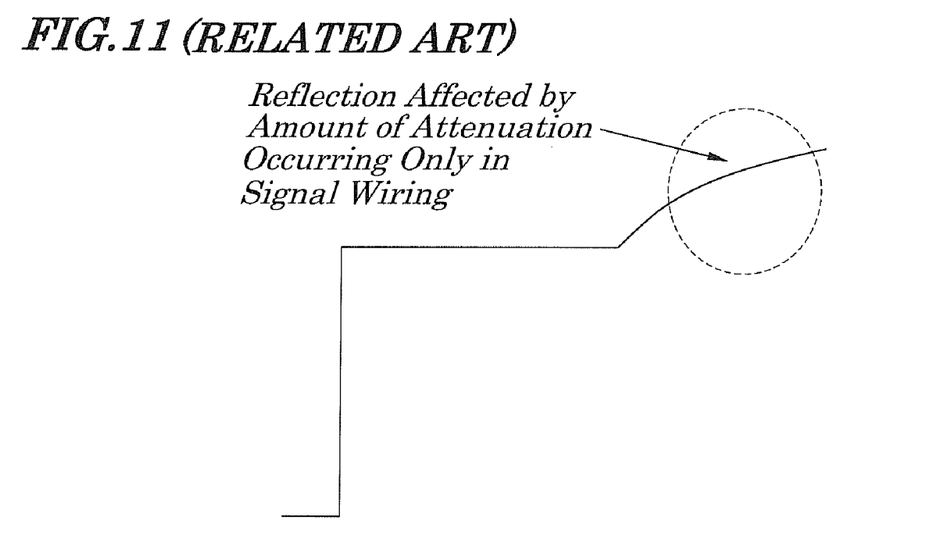
FIG. 11 is a diagram showing a waveform of a reflected signal generated when reflection occurs at a receiving terminal of the related signal wiring of FIG. 10.

Moreover, the pre-emphasis automatic adjusting means disclosed in the above Patent Reference 1 can resolve almost all the disadvantages of the above known system, however, the related system is configured on a presumption that an ideal signal transmission path 107b having no through hole is formed on a circuit board 107a (see FIG. 10) and a step signal is totally reflected (see FIG. 11) and, therefore, the related pre-emphasis automatic adjusting means requires further improvement.

SUMMARY OF THE INVENTION

In view of the above, it is an object of the present invention to provide a pre-emphasis automatic adjusting system, a method of adjusting pre-emphasis, and an emphasis setting signal generating circuit, which are capable of placing, on a transmitting signal, pre-emphasis effective for compensating for attenuation occurring in a mismatched portion of a signal transmission path.

According to a first exemplary aspect of the present invention, there is provided a pre-emphasis automatic adjusting system for adjusting specified emphasis to be placed on a transmitting signal fed to a receiving device from a transmitting device based on a pre-emphasis adjusting signal transmitted via a signal transmission path and then returned back to the transmitting device by being reflected by the receiving device, the transmitting device including:

a detecting unit which detects a degree of attenuation of the pre-emphasis adjusting signal returned back from the receiving device occurring in a mismatched portion of the signal transmission path; and an adjusting unit which adjusts the emphasis to be placed on the transmitting signal based on the degree of attenuation detected by the detecting unit.

According to a second exemplary aspect of the present invention, there is provided a pre-emphasis automatic adjusting method for adjusting specified emphasis to be placed on a transmitting signal fed to a receiving device from a transmitting device based on a pre-emphasis adjusting signal transmitted via a signal transmission path and then returned back to the transmitting device by being reflected by the receiving device, including:

detecting a degree of attenuation of the pre-emphasis adjusting signal returned back from the receiving device occurring in a mismatched portion of the signal transmission path; and adjusting emphasis to be placed on the transmitting signal based on a degree of the attenuation detected.

According to a third exemplary aspect of the present invention, there is provided an emphasis setting signal generating circuit connected to a connecting point between a transmitting device and a signal transmission path having a mismatched portion for adjusting a specified amount of emphasis to be placed on a transmitting signal transmitted from the transmitting device in response to a pre-emphasis adjusting signal reflected by a receiving device and inputted from a connecting point, including:

a reference voltage source which outputs a preset reference voltage for a degree of attenuation of a pre-emphasis adjusting signal occurring in a mismatched portion;

a comparison circuit connected to the reference voltage source and the connecting point to compare the reference voltage with the pre-emphasis adjusting signal; and an outputting circuit which outputs an emphasis setting signal corresponding to the attenuation based on an output from the comparison circuit.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EXEMPLARY EMBODIMENTS

Best modes of carrying out the present invention will be described in further detail using various exemplary embodiments with reference to the accompanying drawings.

Outline of Exemplary Embodiment

According to an outline of an exemplary embodiment of the present invention, there is provided a pre-emphasis automatic adjusting system 10A for adjusting specified emphasis to be placed on a transmitting signal fed to a receiving circuit 16 from a transmitting circuit 12 based on a pre-emphasis adjusting signal transmitted via a signal transmission path and then returned back to the transmitting circuit 12 by being reflected by the receiving circuit 16, the transmitting circuit 12 including:

a detecting circuit 18 which detects a degree of attenuation of the pre-emphasis adjusting signal returned back from the receiving circuit occurring in a mismatched portion of the signal transmission path; and an adjusting circuit 20 which adjusts the emphasis to be placed on the transmitting signal based on the degree of attenuation detected by the detecting circuit 18.

In the foregoing, the pre-emphasis adjusting signal may be a step signal. Also, the mismatched portion may be a capacitive reflected portion, for example, a through hole in the signal transmission path, or an inductive reflected portion.

Also, the detecting circuit 18 may include a reference voltage source, for example, a reference voltage source 18*f* (FIG. 1) which outputs a reference voltage to be set in advance and a comparison circuit 18*d* connected to a connecting point between the transmitting circuit 12 and the signal transmission path 14 and to the reference voltage source 18*f* which compares the reference voltage with the pre-emphasis adjusting signal inputted from the connecting point.

Figure 6:
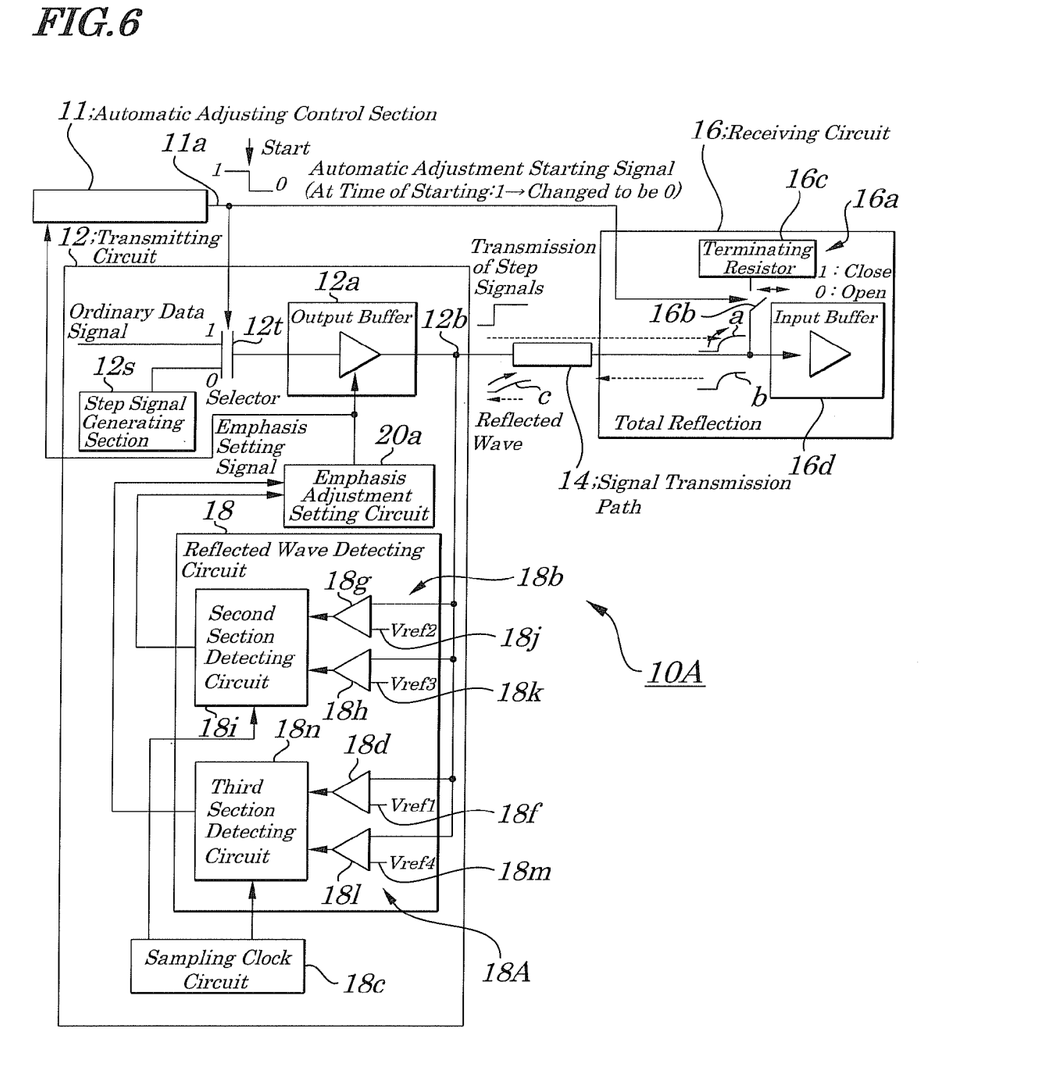
FIG. 6 is a diagram showing electrical configurations of a pre-emphasis automatic adjusting system according to a second exemplary embodiment of the present invention.

Also, the reference voltage source, as shown in FIG. 6, may include a first reference voltage source 18*f* which outputs a first reference voltage to be set in advance, a second reference voltage source 18*m* which outputs a second reference voltage to be set in advance being different from the first reference voltage, a first comparison circuit 18*d* which compares the first reference voltage with the pre-emphasis adjusting signal inputted from the connecting point, and a second comparison circuit 18*l* which compares the second reference voltage with the pre-emphasis adjusting signal to be input from the connecting point.

Also, the adjusting circuit may perform the adjustment by obtaining an emphasis setting value corresponding to a degree of the attenuation detected out of emphasis setting values corresponding to a plurality of degrees of the attenuation obtained in advance.

Furthermore, the pre-emphasis adjusting signal may be transmitted after a termination releasing signal is transmitted from the transmitting circuit 12 through the signal transmission path 14 to the receiving circuit 16 to release the termination of the receiving circuit 16.

With the above configurations, by detecting a degree of attenuation of a pre-emphasis adjusting signal transmitted from the transmitting circuit 12 to the receiving circuit 16 and reflected by the receiving circuit 16 and then returned back to the transmitting circuit 12, emphasis to be placed on a transmitting signal based on the degree of the attenuation is adjusted and, therefore, it is made possible to obtain the best suitable emphasis for the attenuation occurring in the mismatched portion in a very short time. Moreover, the procedures for the adjustment can be greatly simplified.

First Exemplary Embodiment

Figure 1:
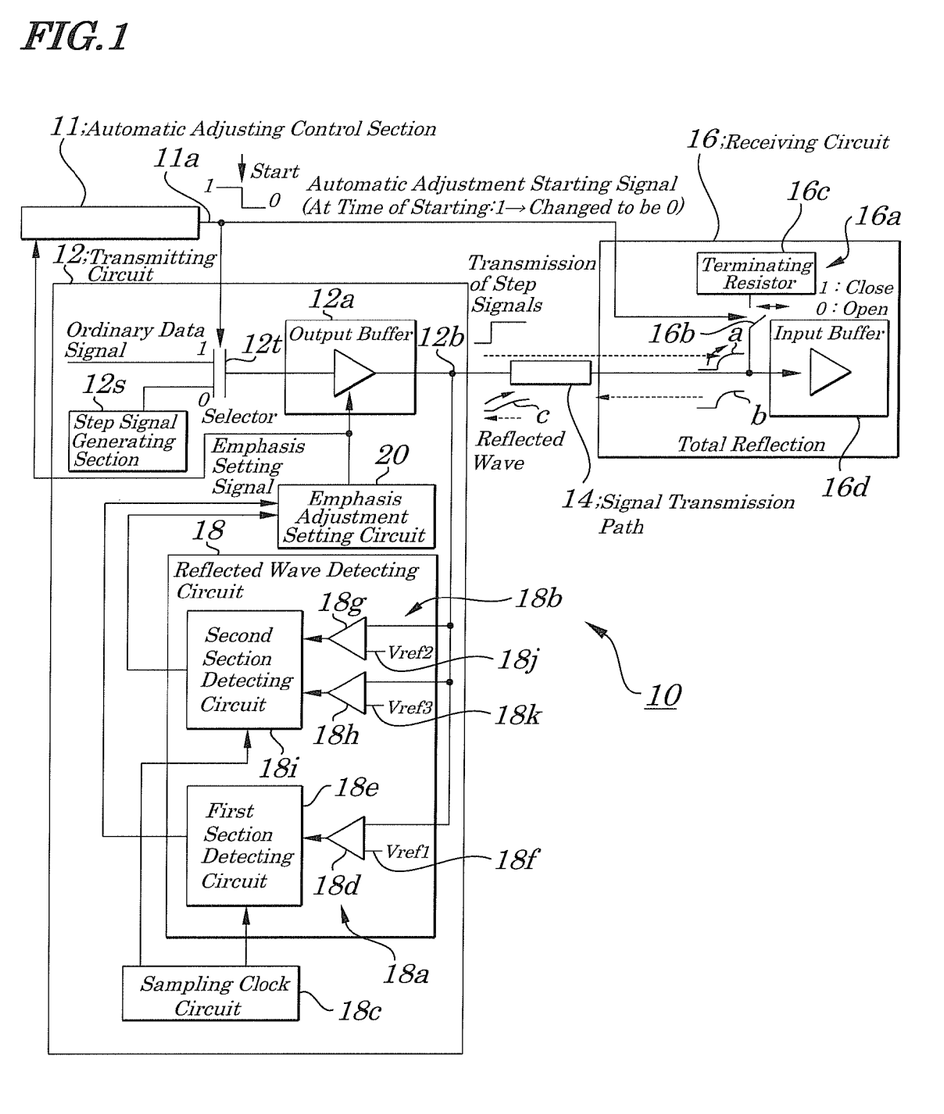
FIG. 1 is a diagram showing electrical configurations of a pre-emphasis automatic adjusting system according to a first exemplary embodiment of the present invention.
Figure 2:
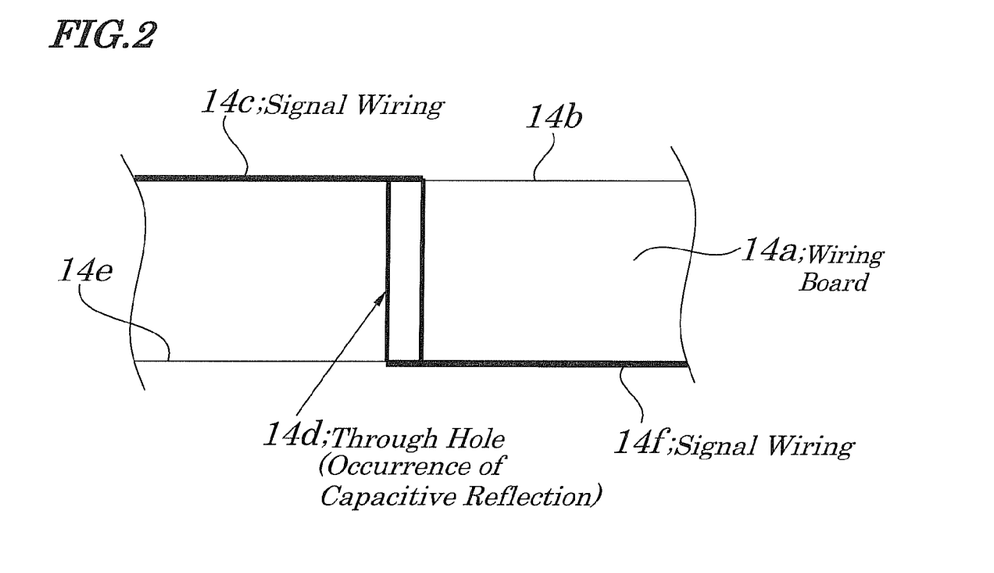
FIG. 2 is a diagram showing a signal wiring having a through hole to be used as a signal transmission path of FIG. 1.
Figure 3:
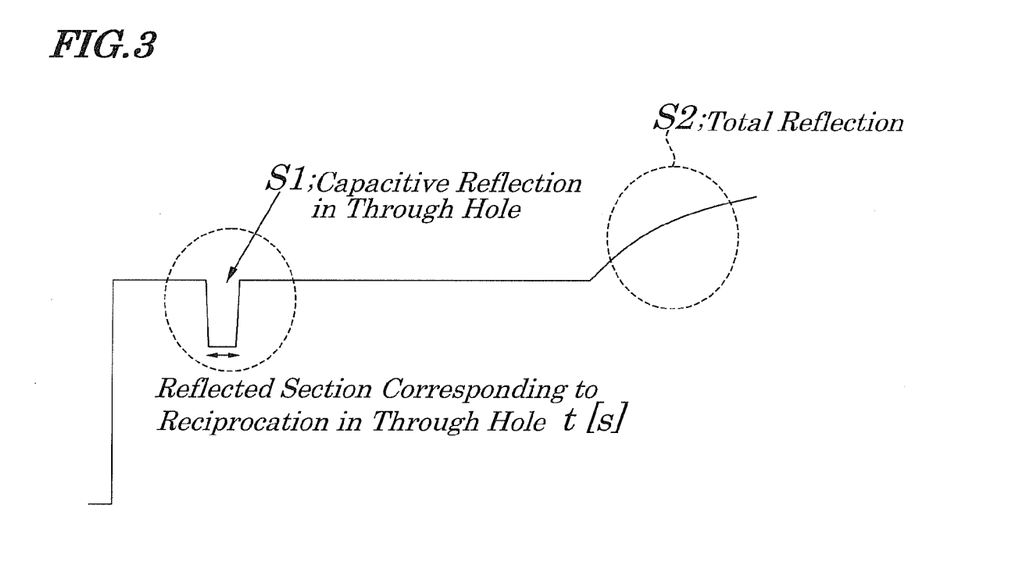
FIG. 3 is a diagram showing a waveform of a reflected signal appearing when reflection occurs at a signal receiving terminal of the signal transmission path of FIG. 2.
Figure 4:
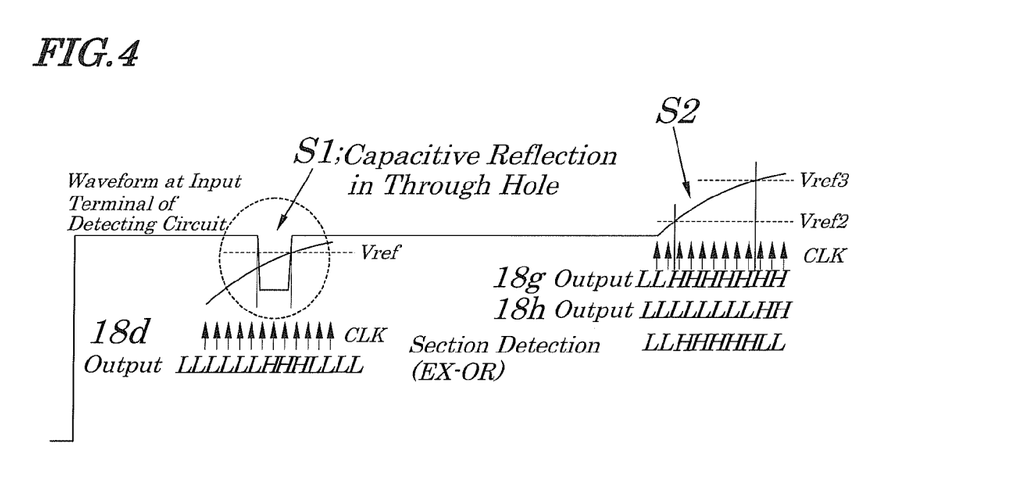
FIG. 4 is a diagram explaining an operation of the pre-emphasis automatic adjusting system shown in FIG. 1 when the signal transmission path of FIG. 1 is the signal wiring having the through hole.

FIG. 1 is a diagram showing electrical configurations of a pre-emphasis automatic adjusting system of the first exemplary embodiment of the present invention. FIG. 2 is a diagram showing a signal wiring having a through hole to be used as a signal transmission path of FIG. 1. FIG. 3 is a diagram showing a waveform of a reflected signal appearing when reflection occurs at a signal receiving terminal of the signal transmission path of FIG. 2. FIG. 4 is a diagram explaining an operation of the pre-emphasis automatic adjusting system shown in FIG. 1 when the signal transmission path of FIG. 1 is a signal wiring having the through hole. The pre-emphasis automatic adjusting system 10 of the first exemplary embodiment is a circuit being capable of placing the most suitable pre-emphasis even when the signal wiring has the through hole and includes an automatic adjusting control section 11, a transmitting circuit 12, the signal transmission path 14, a receiving circuit 16, a reflected wave detecting circuit 18, and an emphasis adjustment setting circuit 20.

The automatic adjusting control section 11 is configured to transmit an automatic adjustment starting signal through a signal line 11*a* to the receiving circuit 16 and to stop transmission of the automatic adjustment starting signal in response to an emphasis setting signal fed from the emphasis adjustment setting circuit 20. The transmitting circuit 12 includes an output buffer 12*a*, a step signal generating section 12*s* and a selector 12*t*. The output buffer 12*a* has a function of placing emphasis on a transmitting signal corresponding to an emphasis setting value. In the signal transmission path 14, as shown in FIG. 2 as an example, the signal wiring 14*c* formed on one side 14*b* of a wiring board 14*a* is connected to a signal wiring 14*f* formed on another side 14*e* of the wiring board 14*a* through the through hole 14*d* for a signal layer switching formed in the wiring board 14*a*. The through hole 14*d* is a transmission path portion which provides capacitive reflection for a signal to be transmitted.

The receiving circuit 16 has a terminating circuit 16*a* made up of a switch 16*b* and a terminating resistor 16*c* which is opened and closed according to the automatic adjustment starting signal transmitted from the automatic adjusting control section 11. An input buffer 16*d* is connected to the signal transmission path 14.

The reflected detecting circuit 18 is made up of a first reflected wave detecting circuit 18*a*, a second reflected wave detecting circuit 18*b* and a sampling clock circuit 18*c*.

The first reflected wave detecting circuit 18*a* has the first comparison circuit 18*d* and a first section detecting circuit 18*e*. The first comparison circuit 18*d* is connected to an output from a first reference voltage source 18*f* to output a first reference voltage Vref1 and to a connecting point 12*b* between the output buffer 12*a* and the signal transmission path 14 and an output from the connecting point 12*b* is connected to the first section detecting circuit 18*e*. The first reference voltage Vref1 is a reference voltage to be pre-set in order to detect a low-level signal of a reflected wave signal. The first section detecting circuit 18*e* is configured to output a high level signal (output 18*d* in FIG. 4) when a signal from the first comparison circuit 18*d* is less than the first reference voltage Vref1 in response to a signal from the first comparison circuit 18*d* and a sampling clock from a sampling clock circuit 18*c* from the first comparison circuit 18*d* and to output a low level voltage (output 18*d* in FIG. 4) when a signal exceeds the first reference voltage Vref1. A signal being generated for a period of time while a signal from the first section detecting circuit 18*e* is at a high level is called a "section detecting signal". An output from the first section detecting circuit 18*e* is connected to an input for the first section detecting signal of the emphasis adjustment setting circuit.

The second reflected wave detecting circuit 18*b* is made up of a second comparison circuit 18*g*, a third comparison circuit 18*h*, and a second section detecting circuit 18*i*. The second comparison circuit 18*g* is connected to an output from a second reference voltage source 18*j* to output a second reference voltage Vref2 and the connecting point 12*b* described above and its output is connected to one input from the second section detecting circuit 18*i*. The third comparison circuit 18*h* is connected to a third output from a third reference voltage source 18*k* to output a third reference voltage Vref3 and the connecting point 12*b* described above and its output is connected to another input for the second section detecting circuit 18*i*.

The second reference voltage Vref2 is a reference voltage preset to a reflected wave signal in order to detect a specified low signal level and the third reference voltage Vref3 is a reference voltage preset to a reflected wave signal in order to detect a specified high signal level. The second section detecting circuit 18*i* is configured to output, in response to signal level output from the second comparison circuit 18*g* and the third comparison circuit 18*h* (18*g* output and 18*h* output in FIG. 4) and a sampling clock from the sampling clock circuit 18*c*, results from exclusive OR operations performed on above two output signals. When a voltage of a reflected wave signal is between the second reference voltage Vref2 and the third reference voltage Vref3, the signal output from the second section detecting circuit 18*i* (section detection [EX-OR] in FIG. 4) is called the second section detecting signal. An output from the second section detecting circuit 18*i* is connected to the second section detecting signal input for the emphasis adjustment setting circuit 20.

The emphasis adjustment setting circuit 20 is configured to receive each section detecting signal and to generate an emphasis setting signal containing an emphasis setting value corresponding to each section detecting signal. An output from the emphasis adjustment setting circuit 20 is connected to the output buffer 12*a* of the transmitting circuit 12. The emphasis setting signal is used to restore a low level "0" to a high level "1" both representing an automatic adjustment starting signal fed to the automatic adjusting control section 11. The emphasis setting value is a value to be set to each section detecting signal obtained using an evaluation board of the signal transmission path 14 and to be held by the emphasis adjustment setting circuit 20.

Next, operations of the exemplary embodiment are described by referring to FIGS. 1 to 5. Prior to the transmission of an ordinary signal from the transmitting circuit 12 to the receiving circuit 16, an automatic adjustment starting signal is first transmitted from the automatic adjusting control section 11 through the signal line 11a to the selector 12t and receiving circuit 16. The selector 12t, when receiving this automatic adjustment starting signal, switches the connection from the step signal generating section 12s to the output buffer 12a and the switch 16b of the receiving circuit 16 is opened to release a specified termination. Then, a step signal ("S" in FIG. 1, that is, pre-emphasis adjusting signal) is transmitted via the signal transmission path 14 to the receiving circuit 16 being in a state where the termination has been released. A step signal ("a" in FIG. 1) received in a state being attenuated by the signal wiring 14c, the through hole 14d, and the signal wiring 14f of the signal transmission path 14 is totally reflected by the receiving circuit 16 and a signal ("b" in FIG. 1) is returned back to the transmitting circuit 12.

The signal returned by the reflection toward the transmitting circuit 12 is already attenuated, at that time, by the signal wiring 14c, the through hole 14d, and the signal wiring 14f of the signal transmission path 14 and is further attenuated when reaching the connecting point 12b. The state of the attenuation is shown in FIG. 3. As shown in FIG. 3, the reflected signal (reflected wave) contains a portion where capacitive reflection (S1 in FIGS. 3 and 4) occurs in the through hole 14d and total reflection (S2 in FIGS. 3 and 4) occurs in the receiving circuit 16.

Figure 5:
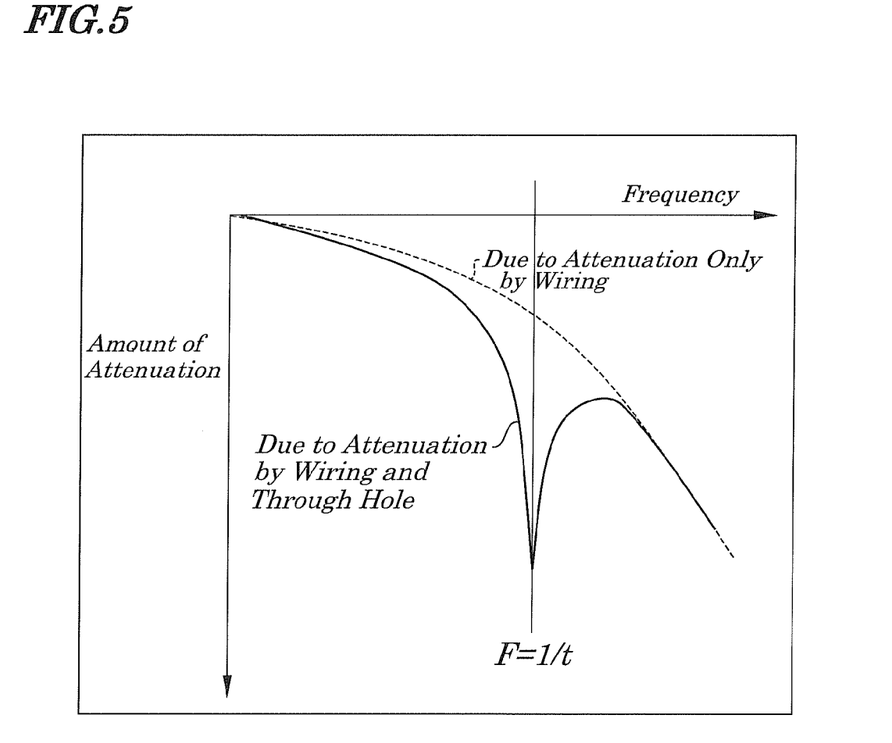
FIG. 5 is a diagram showing signal attenuation characteristics when the signal transmission path of FIG. 1 is the signal wiring having the through hole.

This reflected signal is inputted to the reflected wave detecting circuit 18 from the connecting point 12b. An attenuation component caused by the capacitive reflection (in the through hole) in the reflected signal is detected by the first reflected wave detecting circuit 18a. The state of the detection is described below. A voltage of the reflected signal ("c/" in FIG. 1) is compared with the first reference voltage Vref1 of the first reference voltage source 18d. Before and after the capacitive reflection section where a voltage of the reflected signal exceeds the first reference voltage Vref1 (FIGS. 3 and 4), a low voltage signal (18d output L) is outputted from the first comparison circuit 18d). On the contrary, in the capacitive reflection section, as shown in FIG. 3, an amount of attenuation increases, thus resulting in a drop of signal voltage. If this is expressed by a frequency, f=1/t (sec.) and, when an amount of the attenuation of the signal having a frequency in the neighborhood of "1/t" is expressed by the graph, a peak (resonant point) as shown in FIG. 5 appears. Since such an attenuation occurs in the reflected signal, in the above capacitive reflection section, the signal voltage of the reflected signal becomes less than the first reference voltage Vref1 and the high level signal (18d output H in FIG. 4) is outputted from the first comparison circuit 18d. Therefore, the first section detecting signal is outputted from the first reflected wave detecting circuit 18e and this signal is transferred to the emphasis adjustment setting circuit 20.

After the detection of the attenuation in the above through hole, attenuation components of the reflected signal ("c" in FIG. 1) by the signal wirings 14c and 14f to be inputted from the connecting point 12b to the reflected wave detecting circuit 18 are detected by the second reflected wave detecting circuit 18b. The state of the detection is described below. In the second comparison circuit 18g of the second reflected wave detecting circuit 18b, the voltage of the reflected signal ("c" in FIG. 1) is compared with the second reference voltage Vref2 of the second reference voltage source 18j. When the voltage of the reflected signal is less than the second reference voltage Vref2, a low level signal (18g output L in FIG. 4) is outputted and, when the voltage of the reflected signal exceeds the second reference voltage Vref2, a high level signal (18g output H in FIG. 4) is outputted. The same operation as in the second comparison circuit 18g is performed in the third comparison circuit 18h. That is, the voltage of the reflected signal ("c" in FIG. 1) is compared with the third reference voltage Vref2 of the third reference voltage source 18k. If the voltage of the reflected signal is less than the third reference voltage Vref3, a low level signal (18h output L in FIG. 4) is outputted from the third comparison circuit 18h and, if the voltage of the reflected signal exceeds the third reference voltage Vref3, a high level signal (18h output H in FIG. 4) is outputted from the third comparison circuit 18h. As a result, the second section detecting signal expressed as an exclusive OR of both signals is outputted from the second reflected wave detecting circuit 18i and this signal is transferred to the emphasis adjustment setting circuit 20.

The emphasis adjustment setting circuit 20 is used to transfer, in response to each section detecting signal outputted from the first reflected wave detecting circuit 18e and the second reflected wave detecting circuit 18i, an emphasis setting signal corresponding to each of the section detecting signals is transferred to the output buffer 12a of the transmitting circuit 12 which is used to place emphasis corresponding to the emphasis setting signal on the signal transmitted from the transmitting circuit 12. The emphasis setting signal is fed to the automatic adjusting control 11 to release the transmittance of the automatic adjustment starting signal.

Thus, according to the first exemplary embodiment, in the process of the pre-emphasis automatic adjustment, after releasing of the termination of the receiving circuit, a step signal is transmitted from the transmitting circuit via the signal transmission path having the through hole and an amount of the attenuation in the through hole and an amount of the attenuation of the totally reflected signal are calculated from a slope (attenuation degree) of the reflected wave signal fed from the receiving circuit to obtain an emphasis adjustment setting value based on these amounts of attenuation and, therefore, it is made possible to place the best suitable emphasis for the reflection in the through hole on a transmitting signal. This enables shortening of adjustment time, scale-down of the circuits, and simplification of adjusting procedures.

Second Exemplary Embodiment

FIG. 6 is a diagram showing electrical configurations of a pre-emphasis automatic adjusting system of the second exemplary embodiment of the present invention. Configurations of the pre-emphasis automatic adjusting system of the second exemplary embodiment differ from those of the first exemplary embodiment in that two reference voltages are used for detection of a reflected wave signal in a through hole. That is, as shown in FIG. 6, a featured point of the pre-emphasis automatic adjusting system 10A of the second exemplary embodiment is that a first reflected wave detecting circuit of the first exemplary embodiment is configured as described below. The first reflected wave detecting circuit 18A of the second exemplary embodiment is made up of a first comparison circuit 18d, a fourth comparison circuit 18i, and a third section detecting circuit 18n. The third section detecting circuit 18n is connected to an emphasis adjustment setting circuit 20a. The first comparison circuit 18d is connected to an output from a first reference voltage source 18f to output a first reference voltage Vref1 and to a connecting point 12b described above and its output is connected to an input for the first section detection by the third section detecting circuit 18n. The first reference voltage Vref1 is a reference voltage pre-set for the detection of a first low signal level of a reflected wave signal.

The fourth comparison circuit 18l is connected to an output from a fourth reference voltage source 18m to output the fourth reference voltage Vref4 and to the connecting point 12b described above and its output is connected to an input for the second section detection by the third section detecting circuit 18n. The fourth reference voltage Vref4 is a reference voltage pre-set for the detection of a signal level being higher than the above first signal level.

The third section detecting circuit 18n is configured to output, in response to a signal level outputted from the first comparison circuit 18d and the fourth comparison circuit 18m and a sampling clock fed from a sampling clock circuit 18c, an exclusive OR of the two outputted voltages. When a reflected wave signal exists between the above first reference voltage Vref1 and the fourth reference voltage Vref4, a signal outputted from the third section detecting circuit 18n is the first section detecting signal as in the case of the first exemplary embodiment. An output from the third section detecting circuit 18n is connected to an input for the section detection by the emphasis adjustment setting circuit 20a.

The emphasis adjustment setting circuit 20a is configured to receive each section detecting signal fed from the third section detecting circuit 18n and the second section detecting circuit 18i and to generate an emphasis setting signal containing an emphasis setting value corresponding to each of the section detecting signals. Its output is connected to an output buffer 12a of a transmitting circuit 12. The emphasis setting value is a value obtained in advance and held by the emphasis adjustment setting circuit 20a, as in the case of the first exemplary embodiment.

Next, operations of the pre-emphasis automatic adjusting system of the second exemplary embodiment are described by referring to FIG. 6. The operations of the second exemplary embodiment differ from the first exemplary embodiment only in a state of generation of the first section detecting signal as follows and operations other than this are the same. The first section detecting signal of the second exemplary embodiment is outputted from the third reflected wave detecting circuit 18A in the manner described below. That is, a signal voltage of the reflected signal ("c" in FIG. 6) is compared with the first reference voltage Vref1 of the first reference voltage source 18f in the first comparison circuit 18d. When a voltage of a reflected signal is less than the first reference voltage Vref1, a low level signal is outputted from the first comparison circuit 18d and, if a voltage of the reflected signal exceeds the first reference voltage Vref1, a high level signal is outputted from the first comparison circuit 18d.

Then, a voltage of the reflected signal ("c/" in FIG. 1) is compared with the fourth reference voltage Vref4 of the fourth reference voltage source 18m in the fourth comparison circuit 18l. When the voltage of the reflected signal is less than the fourth reference voltage Vref4, a low level signal is outputted from the fourth comparison circuit 18l and, when the voltage of the reflected signal exceeds the fourth reference voltage Vref4, the high level signal is outputted from the fourth comparison circuit 18l. An exclusive OR of a signal outputted from the first comparison circuit 18d and a signal of the fourth comparison circuit 18l is calculated and the first section detecting signal is outputted from the third reflected wave detecting circuit 18n and this signal is transferred to the emphasis adjustment setting circuit 20a.

The emphasis adjustment setting circuit 20a having received the above first section detecting signal and the second section detecting signal fed from the second section detecting circuit 18b transfers an emphasis setting signal, in response to each section detecting signal, to the output buffer 12a and an automatic adjusting control section 11, as in the case of the first exemplary embodiment. The emphasis setting signal is used to release the transmission of the automatic adjustment starting signal and to place emphasis on a signal transmitted from the transmitting circuit 12.

Thus, according to the second exemplary embodiment, the effect can be obtained that it is made possible to place the best suitable emphasis on a transmitting signal against the reflection occurring in a through hole of the signal transmission path having the through hole.

While the invention has been particularly shown and described with reference to exemplary embodiments thereof, the invention is not limited to theses exemplary embodiments. It will be understood by those of ordinary skill in the art that various changes in form and details may be made therein without departing from the sprit and scope of the present invention as defined by the claims. For example, the present invention can be applied to a signal transmission path where a capacitive reflection or inductive reflection other than the reflection occurring in the through hole occurs. Also, in the above exemplary embodiment, an example of using the step signal for the pre-emphasis automatic adjustment is shown, however, any signal able to be used equivalently in the same manner as the step signal may be also applied. Moreover, in the above exemplary embodiment, the case of the total reflection is explained, however, any reflection type other than that occurring in the exemplary embodiment may be employed.

Furthermore, the pre-emphasis automatic adjusting system disclosed above can be used in various signal transmission paths in addition to the implementation of the wiring board.

What is claimed is:

1. A pre-emphasis automatic adjusting system for adjusting specified emphasis to be placed on a transmitting signal fed to a receiving device from a transmitting device based on a pre-emphasis adjusting signal transmitted via a signal transmission path and then returned back to the transmitting device by being reflected by the receiving device, the transmitting device comprising:
   a detecting unit which detects a degree of attenuation of said pre-emphasis adjusting signal returned back from said receiving device occurring in a mismatched portion of said signal transmission path; and
   an adjusting unit which adjusts the emphasis to be placed on said transmitting signal based on the degree of attenuation detected by said detecting unit,
   wherein said detecting unit comprises a reference voltage source which outputs a reference voltage to be set in advance and a comparison circuit connected to a connecting point between said transmitting device and said signal transmission path and to said reference voltage source to compare said reference voltage with said pre-emphasis adjusting signal inputted from said connecting point,
   wherein said reference voltage source comprises a first reference voltage source which outputs a first reference voltage to be set in advance, a second reference voltage source which outputs a second reference voltage to be set in advance being different from said first reference voltage, and
   wherein said comparison circuit comprises a first comparison circuit which compares said first reference voltage with said pre-emphasis adjusting signal inputted from said connecting point, and a second comparison circuit which compares said second reference voltage with said pre-emphasis adjusting signal to be input from said connecting point.

2. The pre-emphasis automatic adjusting system according to claim 1, wherein said pre-emphasis adjusting signal is a step signal.

3. The pre-emphasis automatic adjusting system according to claim 1, wherein said mismatched portion is a capacitive reflected portion or an inductive reflected portion.

4. The pre-emphasis automatic adjusting system according to claim 3, wherein said capacitive reflected portion is a through hole in said signal transmission path.

5. The pre-emphasis automatic adjusting system according to claim 1, wherein said adjusting unit performs the adjustment by obtaining an emphasis setting value corresponding to a degree of the attenuation detected out of emphasis setting values corresponding to a plurality of degrees of the attenuation obtained in advance.

6. The pre-emphasis automatic adjusting system according to claim 1, wherein said pre-emphasis adjusting signal is transmitted after a termination releasing signal is transmitted from said transmitting device through said signal transmission path to said receiving device to release the termination of said receiving device.

7. A pre-emphasis automatic adjusting method for adjusting specified emphasis to be placed on a transmitting signal fed to a receiving device from a transmitting device based on a pre-emphasis adjusting signal transmitted via a signal transmission path and then returned back to said transmitting device by being reflected by said receiving device, comprising:

detecting a degree of attenuation of said pre-emphasis adjusting signal returned back from said receiving device occurring in a mismatched portion of said signal transmission path; and adjusting emphasis to be placed on said transmitting signal based on a degree of the attenuation detected, wherein a degree of said attenuation is detected based on a first result from detection performed based on a preset first reference voltage and on a voltage of said pre-emphasis adjusting signal to be received on said transmitting device side and on a second result from detection performed based on a preset second reference voltage being different from said first reference voltage and on a voltage of said pre-emphasis adjusting signal to be received on said transmitting device side.

8. The pre-emphasis automatic adjusting method according to claim 7, wherein said pre-emphasis adjusting signal is a step signal.

9. The pre-emphasis automatic adjusting method according to claim 7, wherein said mismatched portion is a capacitive reflected portion or inductive reflected portion.

10. The pre-emphasis automatic adjusting method according to claim 9, wherein said capacitive reflected portion is a through hole in said signal transmission path.

11. The pre-emphasis automatic adjusting method according to claim 7, wherein said emphasis adjustment is performed by obtaining an emphasis setting value corresponding to a degree of attenuation detected out of emphasis setting values corresponding to a plurality of degrees of attenuation obtained in advance.

12. The pre-emphasis automatic adjusting method according to claim 7, wherein said pre-emphasis adjusting signal is transmitted after a termination releasing signal is transmitted from said transmitting device through said signal transmission path to said receiving device to release the termination of said receiving device.

13. An emphasis setting signal generating circuit connected to a connecting point between a transmitting device and a signal transmission path having a mismatched portion for adjusting a specified amount of emphasis to be placed on a transmitting signal transmitted from said transmitting device in response to a pre-emphasis adjusting signal reflected by a receiving device and inputted from a connecting point, comprising:

a reference voltage source which outputs a preset reference voltage for a degree of attenuation of a pre-emphasis adjusting signal occurring in a mismatched portion;

a comparison circuit connected to said reference voltage source and said connecting point to compare the reference voltage with said pre-emphasis adjusting signal; and an outputting circuit which outputs an emphasis setting signal corresponding to said attenuation based on an output from said comparison circuit, wherein said reference voltage source comprises a first reference voltage source which outputs a first reference voltage to be set in advance and a second reference voltage source which outputs a second reference voltage to be set in advance being different from said first reference voltage, wherein said comparison circuit comprises a first comparison circuit which compares said first reference voltage with said pre-emphasis adjusting signal inputted from said connecting point and a second comparison circuit which compares said second reference voltage with said pre-emphasis adjusting signal to be inputted from said connecting point, and wherein said outputting circuit is a circuit which outputs an emphasis setting signal corresponding to said attenuation based on outputs from said first comparison circuit and said second comparison circuit.

14. The emphasis setting signal generating circuit according to claim 13, wherein said pre-emphasis adjusting signal is a step signal.

15. The emphasis setting signal generating circuit according to claim 13, wherein said mismatched portion is a capacitive reflected portion or inductive reflected portion.

16. The emphasis setting signal generating circuit according to claim 13, wherein said capacitive reflected portion is a through hole of said signal transmission path.

17. A pre-emphasis automatic adjusting system for adjusting specified emphasis to be placed on a transmitting signal fed to a receiving means from a transmitting means based on a pre-emphasis adjusting signal transmitted via a signal transmission path and then returned back to the transmitting means by being reflected by the receiving means, the transmitting means comprising:

a detecting means which detects a degree of attenuation of said pre-emphasis adjusting signal returned back from said receiving means occurring in a mismatched portion of said signal transmission path; and an adjusting means which adjusts the emphasis to be placed on said transmitting signal based on the degree of attenuation detected by said detecting means, wherein said detecting means comprises a reference voltage source which outputs a reference voltage to be set in advance and a comparison means connected to a connecting point between said transmitting means and said signal transmission path and to said reference voltage source to compare said reference voltage with said pre-emphasis adjusting signal inputted from said connecting point, wherein said reference voltage source comprises a first reference voltage source which outputs a first reference voltage to be set in advance, a second reference voltage source which outputs a second reference voltage to be set in advance being different from said first reference voltage, and wherein said comparison means comprises a first comparison means which compares said first reference voltage with said pre-emphasis adjusting signal inputted from said connecting point, and a second comparison means which compares said second reference voltage with said pre-emphasis adjusting signal to be input from said connecting point.

18. The pre-emphasis automatic adjusting system according to claim 17, wherein said adjusting means performs the adjustment by obtaining an emphasis setting value corresponding to a degree of the attenuation detected out of emphasis setting values corresponding to a plurality of degrees of the attenuation obtained in advance.

* * * * *